(12) United States Patent
Kim et al.

(10) Patent No.: US 11,296,300 B2
(45) Date of Patent: Apr. 5, 2022

(54) DISPLAY APPARATUS AND METHOD OF MANUFACTURING THE SAME

(71) Applicant: Samsung Display Co., Ltd., Yongin-si (KR)

(72) Inventors: Jaeneung Kim, Yongin-si (KR); Changyong Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/830,215

(22) Filed: Mar. 25, 2020

(65) Prior Publication Data
US 2020/0335717 A1    Oct. 22, 2020

(30) Foreign Application Priority Data
Apr. 16, 2019  (KR) .......................... 10-2019-0044474

(51) Int. Cl.
| | | |
|---|---|---|
| H01L 51/52 | (2006.01) | |
| G09F 9/30 | (2006.01) | |
| H01L 27/32 | (2006.01) | |
| H01L 51/56 | (2006.01) | |

(52) U.S. Cl.
CPC ............ *H01L 51/525* (2013.01); *G09F 9/301* (2013.01); *H01L 27/3218* (2013.01); *H01L 27/3246* (2013.01); *H01L 51/5253* (2013.01); *H01L 51/5256* (2013.01); *H01L 51/56* (2013.01); *H01L 2251/301* (2013.01)

(58) Field of Classification Search
CPC ............................... H01L 51/525; G09F 9/301
See application file for complete search history.

(56) References Cited

U.S. PATENT DOCUMENTS

| | | | |
|---|---|---|---|
| 9,508,778 B2 | 11/2016 | Kim et al. | |
| 9,768,237 B2 | 9/2017 | Lin et al. | |
| 9,831,464 B2 | 11/2017 | Nam et al. | |
| 10,026,791 B2 | 7/2018 | Kim et al. | |
| 10,593,741 B2 | 3/2020 | Khachatryan et al. | |
| 2018/0040857 A1* | 2/2018 | Hong | ...................... H01L 51/56 |
| 2019/0165060 A1* | 5/2019 | Choi | .................... H01L 51/0097 |
| 2019/0173042 A1* | 6/2019 | Lim | .......................... G02F 1/13 |
| 2019/0361494 A1* | 11/2019 | Wu | ..................... H04M 1/0214 |

FOREIGN PATENT DOCUMENTS

| | | |
|---|---|---|
| KR | 10-2015-0035409 | 4/2015 |
| KR | 10-2016-0095308 | 8/2016 |
| KR | 10-2017-0017404 | 2/2017 |
| KR | 10-2017-0079529 | 7/2017 |
| KR | 10-1786446 | 10/2017 |
| KR | 10-2018-0130079 | 12/2018 |

* cited by examiner

*Primary Examiner* — Farun Lu
(74) *Attorney, Agent, or Firm* — H.C. Park & Associates, PLC

(57) ABSTRACT

A display apparatus in which spacers are arranged in a lattice pattern on a flat portion of a panel body and are not arranged in a lattice pattern on a folded portion.

20 Claims, 11 Drawing Sheets

DISPLAY APPARATUS AND METHOD OF MANUFACTURING THE SAME

CROSS REFERENCE TO RELATED APPLICATION

This application claims priority from and the benefit of Korean Patent Application No. 10-2019-0044474, filed on Apr. 16, 2019, which is hereby incorporated by reference for all purposes as if fully set forth herein.

BACKGROUND

Field

Exemplary embodiments of the invention relate generally to a display apparatus capable of folding and unfolding a main body thereof and a method of manufacturing the display apparatus.

Discussion of the Background

For example, a display apparatus such as an organic light-emitting display apparatus may be flexibly deformed, and thus may be designed to have a foldable structure for convenient storage and portability.

When a display apparatus is continuously folded and unfolded and stress is repeatedly applied near a folding axis, cracks may occur, and in particular, it is known that the density of spacers on which a deposition mask is mounted affects the occurrence of cracks. When such cracks propagate, a product may be so damaged so that it may not operate normally, and thus appropriate measures are required.

The above information disclosed in this Background section is only for enhancement of understanding of the background of the invention and, therefore, it may contain information that does not constitute prior art.

SUMMARY

One or more embodiments of the inventive concepts include a display apparatus which may suppress the occurrence and propagation of cracks along a folding axis and a method of manufacturing the display apparatus.

Additional features of the inventive concepts will be set forth in the description which follows, and in part will be apparent from the description, or may be learned by practice of the inventive concepts.

According to one or more embodiments, a display apparatus includes: a panel body including a folded portion bent about a folding axis and a flat portion connected to the folded portion; a plurality of pixels arranged over the flat portion and the folded portion; and a plurality of spacers arranged between the plurality of pixels, wherein the plurality of spacers are arranged in a lattice pattern in a plan view on the flat portion, and the plurality of spacers are not arranged in a lattice pattern in a plan view on the folded portion.

The plurality of spacers may not be located on the folded portion.

The plurality of spacers may be arranged in a direction not parallel to the folding axis on the folded portion.

The plurality of spacers may be arranged at regular intervals or may be arranged at irregular intervals.

Each of the plurality of spacers may have a long and narrow shape in a direction parallel to the folding axis.

Each of the plurality of pixels may include a pixel-defining film that defines an emission region and a thin-film encapsulation layer that covers and protects the emission region, wherein each of the plurality of spacers is located between the pixel-defining film and the thin-film encapsulation layer.

The thin-film encapsulation layer may have a multi-layer structure in which an organic film and an inorganic film are stacked.

The thin-film encapsulation layer may have a single-layer structure including an inorganic film.

A deposition mask may be mounted on the plurality of spacers.

According to one or more embodiments, a method of manufacturing a display apparatus includes: forming a plurality of pixels on a panel body including a folded portion bent about a folding axis and a flat portion connected to the folded portion; and forming a plurality of spacers between the plurality of pixels of the panel body, wherein the plurality of spacers are arranged in a lattice pattern in a plan view on the flat portion, and the plurality of spacers are not arranged in a lattice pattern in a plan view on the folded portion.

The plurality of spacers may not be located on the folded portion.

The plurality of spacers may be arranged in a direction not parallel to the folding axis on the folded portion.

The plurality of spacers may be arranged at regular intervals or may be arranged at irregular intervals.

Each of the plurality of spacers may have a long and narrow shape in a direction parallel to the folding axis.

Each of the plurality of pixels may include a pixel-defining film that defines an emission region and a thin-film encapsulation layer that covers and protects the emission region, wherein each of the plurality of spacers is located between the pixel-defining film and the thin-film encapsulation layer.

The thin-film encapsulation layer may have a multi-layer structure in which an organic film and an inorganic film are stacked.

The thin-film encapsulation layer may have a single-layer structure including an inorganic film.

A deposition mask may be mounted on the plurality of spacers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
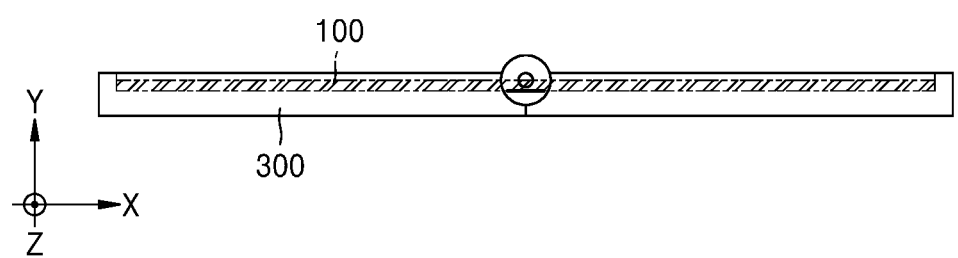
FIG. 1 is a front view illustrating an unfolded state of a display apparatus according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
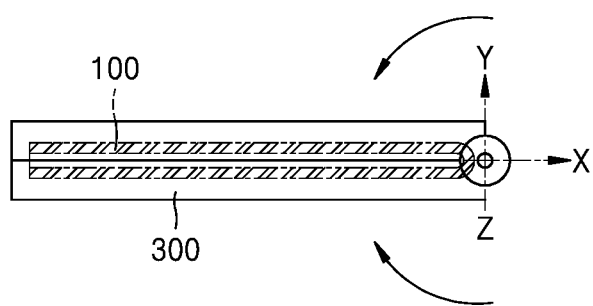
FIG. 2 is a front view illustrating a folded state of the display apparatus of FIG. 1.

FIGS. 1 and 2 are views respectively illustrating an unfolded state and a folded state of a display apparatus according to an embodiment of the present disclosure.

The display apparatus includes a panel body 100 that is flexibly bendable. The panel body 100 has a structure (see FIG. 6) in which a thin-film transistor (TFT) and an light-emitting device for forming an image on a flexible substrate and a thin-film encapsulation layer for covering and protecting the TFT and the light-emitting device are stacked, and may be freely folded and unfolded within the allowable range of its flexibility because the panel body 100 uses the flexible substrate, instead of a rigid glass substrate. Accordingly, in the folded state, the panel body 100 may be folded as shown in FIG. 2.

The panel body 100 may be supported by a case 300 so that the panel body 100 is folded and unfolded as shown in FIGS. 1 and 2, and is folded and unfolded as the case 300 rotates.

Figure 3:
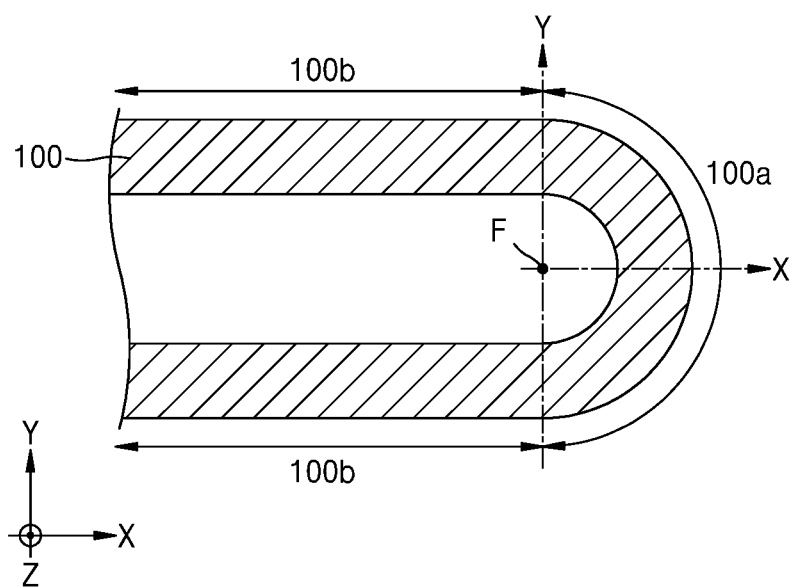
FIG. 3 is a front view illustrating a folded state of a panel body of the display apparatus of FIG. 1.
Figure 4:
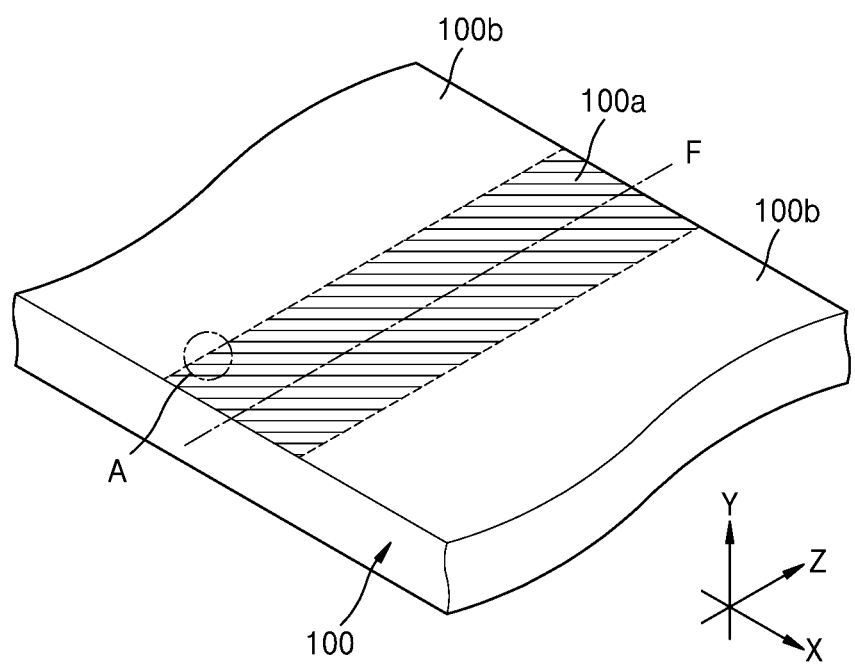
FIG. 4 is a perspective view of the panel body of FIG. 3.

Compressive stress and tensile stress are applied to a folded portion 100a, compared to a flat portion 100b, of the panel body 100 that is repeatedly bent or unbent whenever folding and unfolding are performed as shown in FIGS. 3 and 4. That is, in a folded state of FIG. 3, compressive stress is applied to an inner surface of the folded portion 100a and tensile stress is applied to an outer surface of the folded portion 100a. As such, when stresses in different directions are repeatedly applied, cracks easily occur and propagate in the folded portion 100a. In particular, when spacers 120 (see FIG. 5) are densely arranged in a direction parallel to a folding axis F on the folded portion 100a, the risk of cracks increases. The spacers 120 that are formed by allowing a mask (not shown) to be mounted thereon during deposition of thin films such as emission layers of pixels 110 (see FIG. 5) and protruding around the pixels 110 to prevent damage due to direct contact between the mask and the pixels 110 may apply a relatively large pressure to a thin-film encapsulation layer on the folded portion 100a, thereby leading to cracks.

To understand the principle, cross-sectional structures of the pixel 110 and the spacer 120 will be first described with reference to FIG. 6.

Figure 6:
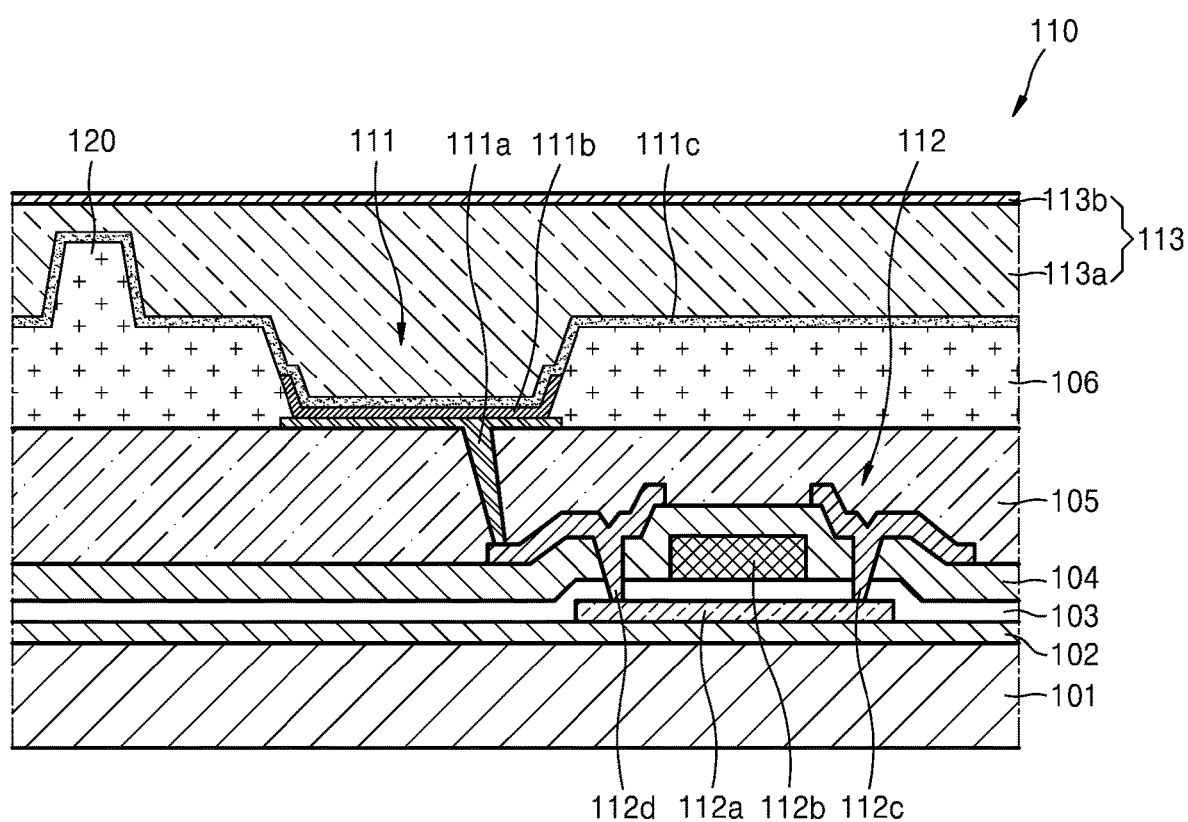
FIG. 6 is a cross-sectional view illustrating inner structures of a spacer and a pixel.

A TFT 112 and an organic light-emitting device 111 are provided in one pixel 110 as shown in FIG. 6. First, upon examining a structure of the TFT 112, an active layer 112a is formed on a buffer layer 102 adjacent to a flexible substrate 101, and the active layer 112a includes source and drain regions heavily doped with N or P-type impurities. The active layer 112a may be formed of an oxide semiconductor. For example, the oxide semiconductor may include an oxide selected from group 12, 13, and 14 metal elements such as zinc (Zn), indium (In), gallium (Ga), tin (Sn), cadmium (Cd), and germanium (Ge) and a combination thereof. For example, the active layer 112a may include $(In_2O_3)a(Ga_2O_3)b(ZnO)c$ (G-I-Z-O) where a, b, and c are real numbers satisfying a≥0, b≥0, and c>0. A gate electrode 112b is formed over the active layer 112a with a gate insulating film 103 therebetween. A source electrode 112c and a drain electrode 112d are formed over the gate electrode 112b. An interlayer insulating film 104 is provided between the gate electrode 112b and each of the source electrode 112c and the drain electrode 112d, and a passivation film 105 is located between an anode 111a of the organic light-emitting device 111 and each of the source electrode 112c and the drain electrode 112d.

A pixel-defining film 106 is formed on the anode 111a, and a predetermined opening is formed in the pixel-defining film 106 and then the organic light-emitting device 111 is formed in the predetermined opening.

The organic light-emitting device 111 displays predetermined image formation by emitting red, green, and blue light according to the flow of current, and includes the anode 111a that is connected to the drain electrode 112d of the TFT 112 and receives positive power from the drain electrode 112d, a cathode 111c that is provided to cover all pixels and supplies negative power, and an emission layer 111b that is located between the anode 111a and the cathode 111c and emits light.

A hole injection layer (HIL), a hole transport layer (HTL), an electron transport layer (ETL), and an electron injection layer (EIL) may be stacked adjacent to the emission layer 111b.

For reference, the emission layer 111b may be formed for each color so that pixels emitting red (R), green (G), and blue (B) light form one unit pixel. Alternatively, the emission layer 111b may be commonly formed over an entire pixel region irrespective of locations of pixels. In this case, the emission layer 111b may be formed by vertically stacking or combining layers including, for example, red, green, and blue light-emitting materials. As long as white light may be emitted, other color light-emitting materials may be used. Also, a color conversion layer or a color filter for converting the emitted white light into light of a predetermined color may be further provided.

A thin-film encapsulation layer 113 in which an organic film 113a and an inorganic film 113b are alternately stacked is located on the cathode 111c and covers and protects the pixel 110. The organic film 113a flattens a curved surface of a lower structure and provides flexibility, and the inorganic film 113b functions as a barrier for preventing penetration of external moisture and oxygen. When necessary, the organic film 113a may be omitted, and the thin-film encapsulation layer 113 may have a single-layer structure including only the inorganic film 113b. The inorganic film 113b may include at least one inorganic material from among aluminum oxide, titanium oxide, tantalum oxide, hafnium oxide, zinc oxide, silicon oxide, silicon nitride, and silicon oxynitride. The organic film 113a may include a polymer-based material. The polymer-based material may include an acrylic resin, an epoxy-based resin, polyimide (PI), and polyethylene. In an embodiment, the organic film 113a may include acrylate.

Reference numeral 120 denotes the spacer on which a mask (not shown) is mounted when the emission layer 111b or the like is deposited as described above, and the spacer 120 may be formed by protruding from a portion of the pixel-defining film 106.

Because the spacer 120 protrudes beyond peripheral portions, the spacer 120 applies a larger pressure to the thin-film encapsulation layer 113 than the peripheral portions in a stress state such as folding. Accordingly, when folding is repeated at a portion where the spacer 120 is present, the risk of cracks occurring in the inorganic film 113b may increase, and once cracks occur in the inorganic film 113b, external moisture and oxygen may penetrate through the cracks, thereby easily deteriorating the emission layer 111b and causing defects.

Accordingly, it is advantageous to reduce the risk of defects due to cracks by distributing the spacers 120, instead of densifying the spacers 120, along the folding axis F where folding occurs on the folded portion 100a.

Figure 5:
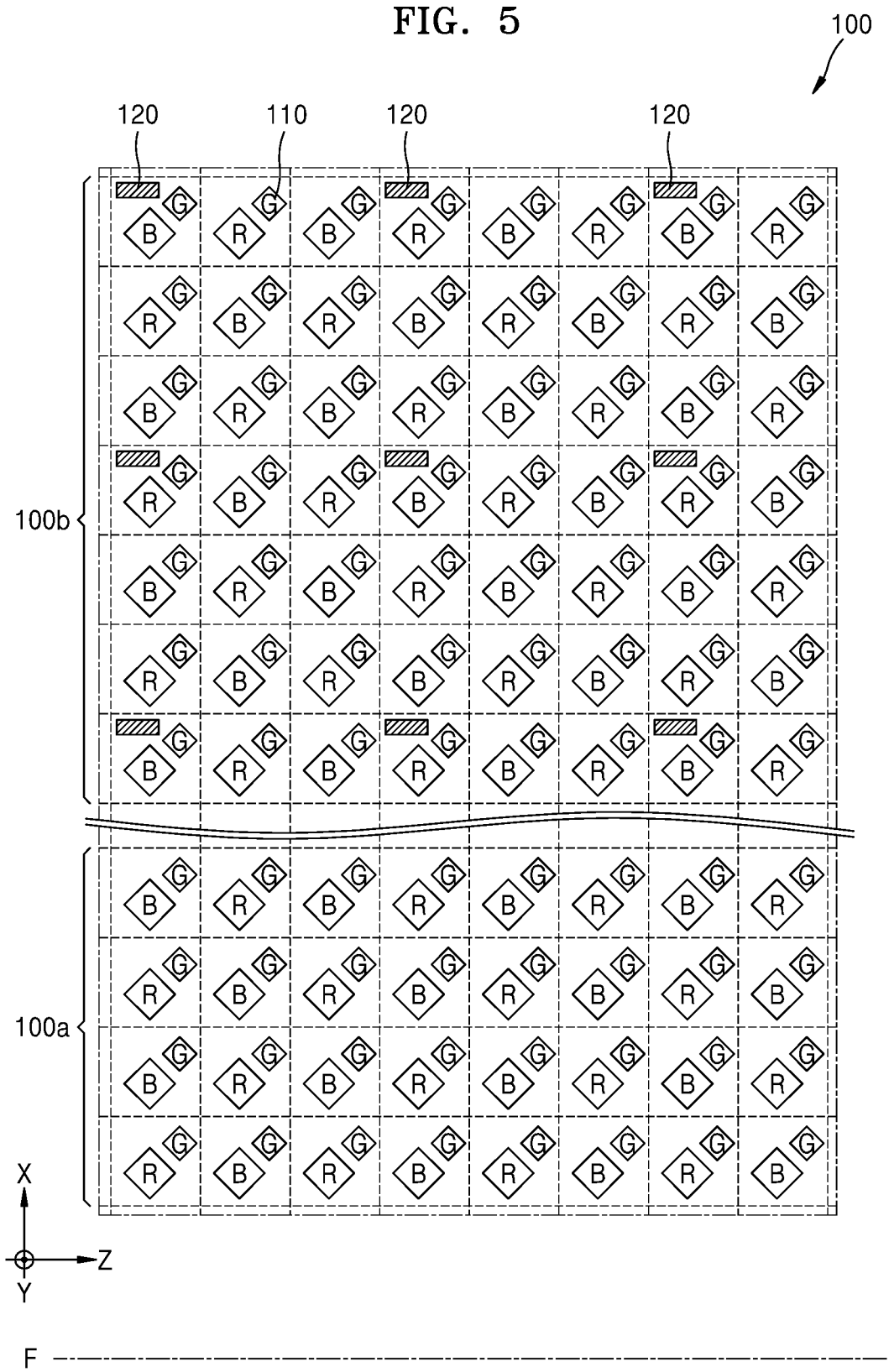
FIG. 5 is an enlarged plan view illustrating a portion A of FIG. 4.

To this end, in the present embodiment, the spacers 120 are arranged on the flat portion 100b and the folded portion 100a as shown in FIG. 5. It will be understood that FIG. 5 does not illustrate actual shapes and sizes of the spacers 120 but schematically illustrates locations for better understanding of an arrangement.

Basically, the spacers 120 do not correspond to the pixels 110 in a one-to-one manner, and one spacer 120 is arranged for multiple pixels 110. That is, the pixels 110 correspond to the spacers 120 in a many-to-one manner.

First, the plurality of spacers 120 are arranged in a checkerboard pattern, that is, a lattice pattern, on the flat portion 100b of the panel body 100 that is not folded. As used herein, a lattice pattern refers to elements arranged in perpendicular rows and columns aligned with the folding axis F. That is, in a plan view, the spacers 120 are arranged at regular intervals in a direction parallel to the folding axis F and are also arranged at regular intervals in a direction perpendicular to the direction parallel to the folding axis F. Accordingly, a mask (not shown) may be stably supported during deposition by the spacers 120 that are arranged at regular intervals.

However, the folded portion 100a that is repeatedly folded and unfolded has no spacer 120. That is, the mask (not shown) is supported by the spacers 120 that are arranged in a lattice pattern on the flat portion 100b, and no spacer 120 is formed on the folded portion 100a to prevent cracks and delamination.

Because a density of the spacers 120 on the folded portion 100a is much lower than that on the flat portion 100b, cracks and delamination due to folding rarely occur.

Accordingly, the occurrence of cracks in the folded portion 100a may be effectively suppressed by adjusting an arrangement of the spacers 120.

The display apparatus constructed as above may be manufactured as follows.

First, the pixel 110 is formed in the panel body 100 that is foldable as shown in FIG. 6.

The spacer 120 is also formed in this process, and in this case, no spacer 120 is formed on the folded portion 100a and the spacer 120 is formed only on the flat portion 100b so that the plurality of spacers 120 are arranged in a lattice pattern as shown in FIG. 5.

Next, the panel body 100 having an improved spacer arrangement structure is coupled to the case 300, as shown in FIG. 1.

When the display apparatus manufactured as described above is stored or carried, it is folded as shown in FIGS. 2 and 3, and thus large stress is applied to the folded portion 100a of the panel body 100. However, because there is no spacer 120 on the folded portion 100a, there is almost no risk of cracks even when folding is repeatedly performed.

When the display apparatus is unfolded so that a user watches an image, the panel body 100 is unfolded flat in an unfolded state as shown in FIGS. 1 and 4. Accordingly, the user may watch a flat image on the panel body 100 that is unfolded flat, and a stable image with no defects due to cracks is provided even on the folded portion 100a.

Figure 7:
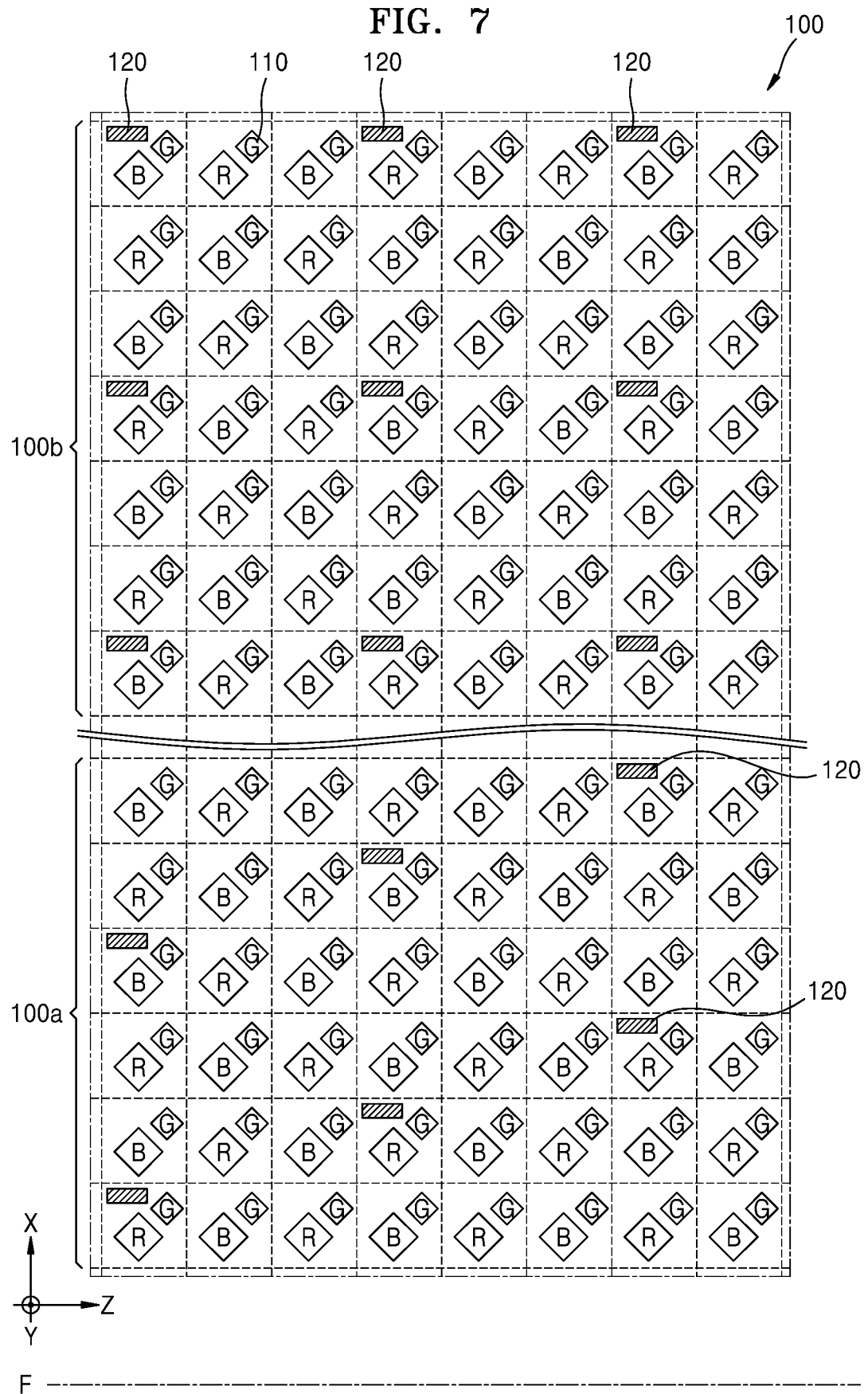
FIGS. 7 and 8 are plan views illustrating modifications of a spacer arrangement of FIG. 5.

Next, FIG. 7 is a view illustrating a display apparatus having a spacer arrangement structure according to another embodiment of the present disclosure.

On the flat portion 100b, the spacers 120 are arranged in a lattice pattern, like in the above embodiment.

However, on the folded portion 100a, unlike in the above embodiment in which there is no spacer 120, the spacers 120 are arranged at regular intervals in an oblique direction that is not parallel to the folding axis F. That is, the spacers 120 are arranged stepwise in a plan view, and therefore not in a lattice pattern as used herein.

In this case, because the spacers 120 even on the folded portion 100a support a mask, the mask may be more stably supported during deposition, and because a density of the spacers 120 is lower than that of the spacers 120 arranged in a lattice pattern on the flat portion 100b in a direction parallel to the folding axis F, the risk of cracks and delamination may be reduced. That is, because a density of the spacers 120 in a direction parallel to the folding axis F is reduced, even when cracks occur due to folding, the cracks may occur only in some small portions, thereby not leading to defects.

Accordingly, according to the present embodiment, a mask may be stably supported and cracks may be effectively suppressed.

Figure 8:
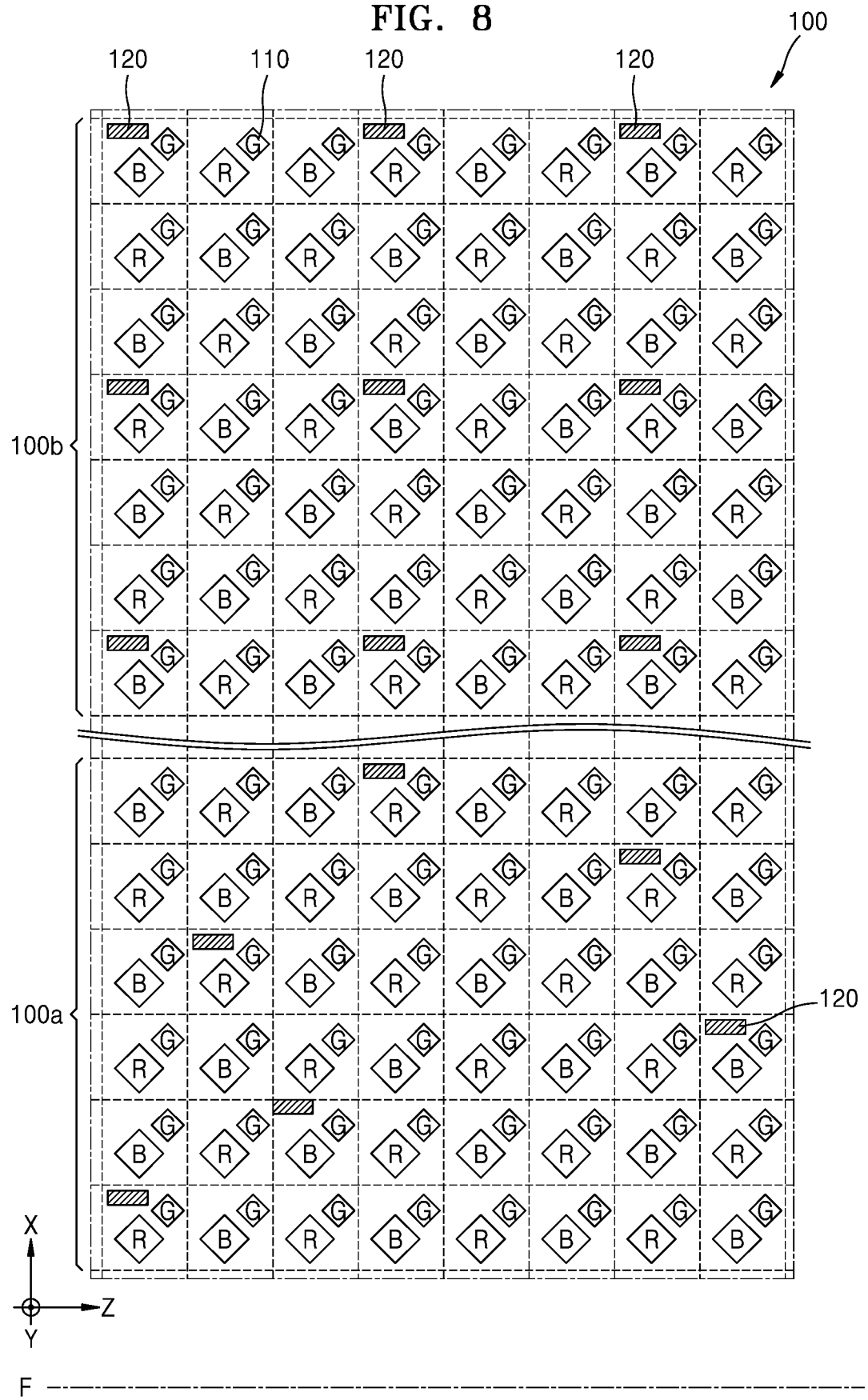

Although the spacers 120 of the folded portion 100a are arranged at regular intervals in an oblique direction in FIG. 7, the spacers 120 may be arranged at irregular intervals as shown in FIG. 8. That is, although a density of the spacers 120 in a direction parallel to the folding axis F is lower than that of the spacers 120 arranged in a lattice pattern, the spacers 120 are arranged at irregular intervals, instead of regular intervals. Accordingly, it is found that a density in a direction parallel to the folding axis F may be reduced without arranging the spacers 120 at regular intervals on the folded portion 100a.

Figure 9A:
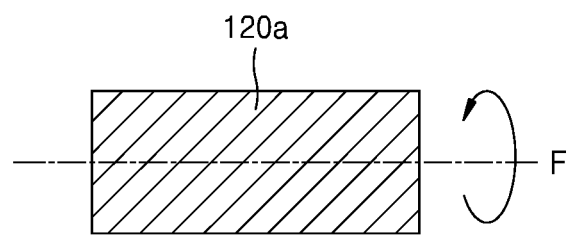
FIGS. 9A, 9B, and 9C are plan views illustrating modifications of each spacer.
Figure 9B:
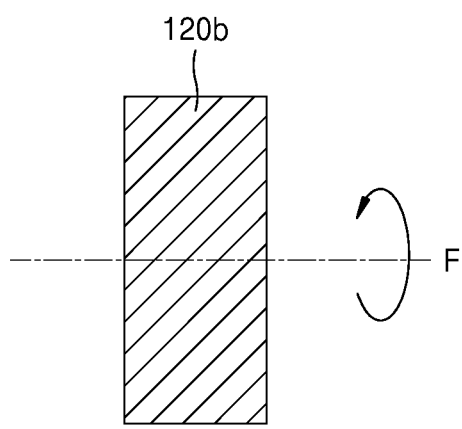
Figure 9C:
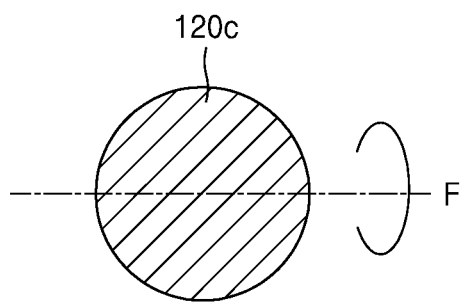

A shape of each of the spacers 120 may be modified in various ways as shown in FIGS. 9A through 9C, and stress applied when the spacer 120 has a long and narrow shape 120a in a direction parallel to the folding axis F as shown in FIG. 9A is less than that applied when the spacer 120 has other shapes 120b and 120c. Because the risk of cracks increases as stress increases, it is preferable that the spacer 120 has the long and narrow shape 120a in a direction of the folding axis F as shown in FIG. 9A.

A display apparatus according to the one or more embodiments may effectively reduce or prevent cracks and defects in a folded portion of a display panel even when folding and unfolding operations are repeatedly performed, thereby achieving stable product quality.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a panel body comprising a folded portion configured to be bent about a folding axis and a flat portion connected to the folded portion;
a plurality of pixels arranged over the flat portion and the folded portion; and
a plurality of spacers arranged between the plurality of pixels,
wherein the plurality of spacers are arranged in a lattice pattern in a plan view on the flat portion, and
all adjacent spacers among the plurality of spacers arranged along a direction parallel to the folding axis on the folded portion are arranged at an oblique angle relative to the folding axis.

2. The display apparatus of claim 1, wherein the plurality of spacers disposed in the folded portion are arranged at regular intervals.

3. The display apparatus of claim 1, wherein the plurality of spacers disposed in the folded portion are arranged at irregular intervals.

4. The display apparatus of claim 1, wherein each of the plurality of spacers has a long and narrow shape in a direction parallel to the folding axis.

5. The display apparatus of claim 1, wherein each of the plurality of pixels comprises a pixel-defining film that defines an emission region and a thin-film encapsulation layer that covers and protects the emission region, and
wherein each of the plurality of spacers is located between the pixel-defining film and the thin-film encapsulation layer.

6. The display apparatus of claim 5, wherein the thin-film encapsulation layer has a multi-layer structure in which an organic film and an inorganic film are stacked.

7. The display apparatus of claim 5, wherein the thin-film encapsulation layer has a single-layer structure comprising an inorganic film.

8. A display apparatus comprising:
a panel body comprising a folded portion configured to be bent about a folding axis and a flat portion connected to the folded portion;
a plurality of pixels arranged over the flat portion and the folded portion; and
a plurality of spacers protruding from a pixel-defining film and arranged between the plurality of pixels on the flat portion,
wherein the plurality of spacers are arranged in a lattice pattern in a plan view on the flat portion, and
the plurality of spacers are not located on the folded portion such that no spacers are disposed in the folded portion.

9. The display apparatus of claim 8, wherein each of the plurality of spacers has a long and narrow shape in a direction parallel to the folding axis.

10. The display apparatus of claim 8, wherein each of the plurality of pixels comprises the pixel-defining film that defines an emission region and a thin-film encapsulation layer that covers and protects the emission region, and
wherein each of the plurality of spacers is located between the pixel-defining film and the thin-film encapsulation layer.

11. The display apparatus of claim 10, wherein the thin-film encapsulation layer has a multi-layer structure in which an organic film and an inorganic film are stacked.

12. The display apparatus of claim 10, wherein the thin-film encapsulation layer has a single-layer structure comprising an inorganic film.

13. A method of manufacturing a display apparatus, the method comprising:
forming a plurality of pixels on a panel body comprising a folded portion configured to be bent about a folding axis and a flat portion connected to the folded portion; and
forming a plurality of spacers between the plurality of pixels of the panel body,
wherein the plurality of spacers are arranged in a lattice pattern in a plan view on the flat portion, and
the plurality of spacers are not arranged in a lattice pattern in a plan view on the folded portion by either:
having all adjacent spacers among the plurality of spacers arranged along a direction parallel to the folding axis on the folded portion arranged at an oblique angle relative to the folding axis, or
having no spacers disposed in the folded portion.

14. The method of claim 13, wherein spacers are disposed in the folded portion and the plurality of spacers disposed in the folded portion are arranged at regular intervals.

15. The method of claim 13, wherein spacers are disposed in the folded portion and the plurality of spacers disposed in the folded portion are arranged at irregular intervals.

16. The method of claim 13, wherein each of the plurality of spacers has a long and narrow shape in a direction parallel to the folding axis.

17. The method of claim 13, wherein each of the plurality of pixels comprises a pixel-defining film that defines an emission region and a thin-film encapsulation layer that covers and protects the emission region, and
wherein each of the plurality of spacers is located between the pixel-defining film and the thin-film encapsulation layer.

18. The method of claim 17, wherein the thin-film encapsulation layer has a multi-layer structure in which an organic film and an inorganic film are stacked.

19. The method of claim 17, wherein the thin-film encapsulation layer has a single-layer structure comprising an inorganic film.

20. The method of claim 13, wherein a deposition mask is mounted on the plurality of spacers.

* * * * *